United States Patent [19]
Hirai

[11] Patent Number: 5,300,892
[45] Date of Patent: Apr. 5, 1994

[54] AUDIO SIGNAL AMPLIFIER CIRCUIT

[75] Inventor: Jun Hirai, Kyoto, Japan

[73] Assignee: Rohm Co., Ltd., Kyoto, Japan

[21] Appl. No.: 942,717

[22] Filed: Sep. 9, 1992

[30] Foreign Application Priority Data

Sep. 11, 1991 [JP] Japan .................. 3-259606

[51] Int. Cl.$^5$ .................. H03F 1/26
[52] U.S. Cl. .................. 330/51; 330/149; 330/307
[58] Field of Search .................. 330/51, 149, 307; 381/94

[56] References Cited
U.S. PATENT DOCUMENTS 5,059,919 10/1991 Kinoshita .................. 330/51

FOREIGN PATENT DOCUMENTS 159011 9/1983 Japan .................. 330/51
89016 5/1984 Japan .................. 330/51

Primary Examiner—James B. Mullins
Attorney, Agent, or Firm—Brumbaugh, Graves, Donohue & Raymond

[57] ABSTRACT

As a switch circuit SW1 is incorporated in an integrated circuit, the number of IC terminals is proportionately reducible. On receiving a mute input signal Min, a mute circuit 13 generates a mute control signal M1 and subsequently a mute control signal M2 later than M1. On receiving the mute control signal M1, the switch circuit SW1 grounds the signal line of an audio output signal A, whereas on receiving the mute control signal M2, a switch circuit SW2 cuts the signal line of an audio input signal I later. A muting function can thus be fulfilled stably.

4 Claims, 2 Drawing Sheets

AUDIO SIGNAL AMPLIFIER CIRCUIT

BACKGROUND OF THE INVENTION

The present invention relates generally to audio signal amplifier circuits and more particularly to audio signal amplifier circuits used for audio signal processing circuits in, for instance, audio equipment, televisions and VTRs, and to an audio signal amplifier circuit in the form of a one-chip integrated circuit having a muting function.

In an audio signal amplifier circuit that employs transistors and the like, unpleasant sound like so-called pop sound ensues when a power switch is turned on and if the worst comes to the worst, a speaker connected to a power amplifier may be damaged. It is therefore the practice generally followed to insert a mute circuit in order to compulsorily cut or ground a path for an audio signal until the power amplifier and the like arrive at a steady stable state.

Referring to a block diagram of FIG. 2, the construction and operation of a specific audio signal amplifier circuit having such a mute circuit will be described.

Numeral 1 denotes an audio signal amplifier circuit which is normally an integrated circuit and comprises an amplifier 2, a mute circuit 3, a switch circuit SW2 and the like. On receiving an audio input signal I, the amplifier 2 amplifies the signal and outputs it as an audio output signal A. The mute circuit 3 receives a mute input signal Min generated (a generator circuit is not shown) to suppress an audio signal, depending on the condition of a power supply circuit or the switch input, and produces a mute control signal M accordingly. The mute control signal M is supplied to an IC terminal 1a and the switch circuit SW2. On receiving the mute control signal M, the switch circuit SW2 cuts the signal line of the audio input signal I. Moreover, a switch circuit SW1 provided outside the integrated circuit grounds the signal line of the audio output signal A on receiving the mute control signal M via the terminal 1a. In this way, a muting function is fulfilled by compulsorily cutting both the input and output sides of the audio signal or reducing them to a reference potential when the conventional audio signal amplifier circuit receives the mute input signal Min.

In the conventional audio signal amplifier circuit, the switch circuit SW1 has thus been arranged as a discrete part but not incorporated in the audio signal amplifier circuit in the form of an integrated circuit. For this reason, the mute control signal M has to be sent to the switch circuit SW1 and one IC terminal is specifically allotted for the purpose.

However, any increase in the number of IC terminals is undesirable because it is against a demand for reducing the IC size and the apparatus itself as well.

Since one mute control signal is used simultaneously to switch two of the switch circuits SW1, SW2, in the case of the operating times of the switch circuits being varied, the switch circuit SW1 of the output side may fail to suppress the noise produced by switching of the switch circuit SW2 of the input side. Accordingly, the muting function is not guaranteed to perform in stability. In other words, the problem is that more man-hours are needed for adjustment and so forth.

SUMMARY OF THE INVENTION

An object of the present invention made to solve the foregoing problems characteristic of the prior art is to provide an audio signal amplifier circuit which has fewer terminals and is not only small in size but also stable in operation and formed of a one-chip integrated circuit.

In order to accomplished the object, an audio signal amplifier circuit according to the present invention comprises an amplifier, a mute circuit, a first switch circuit and a second switch circuit, these parts being incorporated into one-chip IC.

The amplifier operates with a reference potential as an operating point and on receiving an audio input signal, it amplifies this signal and outputs an audio output signal. On receiving a mute input signal, the mute circuit generates a mute control signal in accordance with the mute input signal and controls the first and second switch circuits in the integrated circuit. On receiving the mute control signal, the first switch circuit cuts off the signal line of the audio output signal or short-circuits the signal to the reference potential. On receiving the mute control signal, the second switch circuit cuts off the signal line of the audio input signal.

Another audio signal amplifier circuit of the present invention is such that on receiving a mute input signal, the aforementioned mute circuit generates a first mute control signal in accordance with the mute input signal, and further generates a second mute control signal later than the first mute control signal. Further, on receiving the first mute control signal, the first switch circuit cuts off the signal line of the audio output signal or short-circuits the signal to the reference potential. On receiving the second mute control signal, the second switch circuit cuts the signal line of the audio input signal. In other respects, this circuit is similar to the preceding one in construction.

Since the first switch circuit is incorporated in the integrated circuit, the mute control signal output terminal can be dispensed with and at least one terminal of the integrated circuit forming the audio signal amplifier circuit can be saved. Therefore, the IC size can be reduced to that extent. As no external switch circuit is needed, moreover, this audio signal amplifier circuit contributes to making an apparatus smaller. In addition, the input side of the audio signal is placed under control after the output side thereof is set under control by causing the second mute control signal to be generated later than the first control signal, even though the response time of the switch circuit happens to vary in some degree due to the temperature characteristics, a change with the passage of time and so on. Consequently, the noise produced by switching the switch circuit on the input side is not allowed to leak out. The audio signal amplifier circuit is thus completely prevented from being affected by the aforementioned variation.

DETAILED DESCRIPTION OF THE PREFERRED EMBODIMENT

Figure 1:
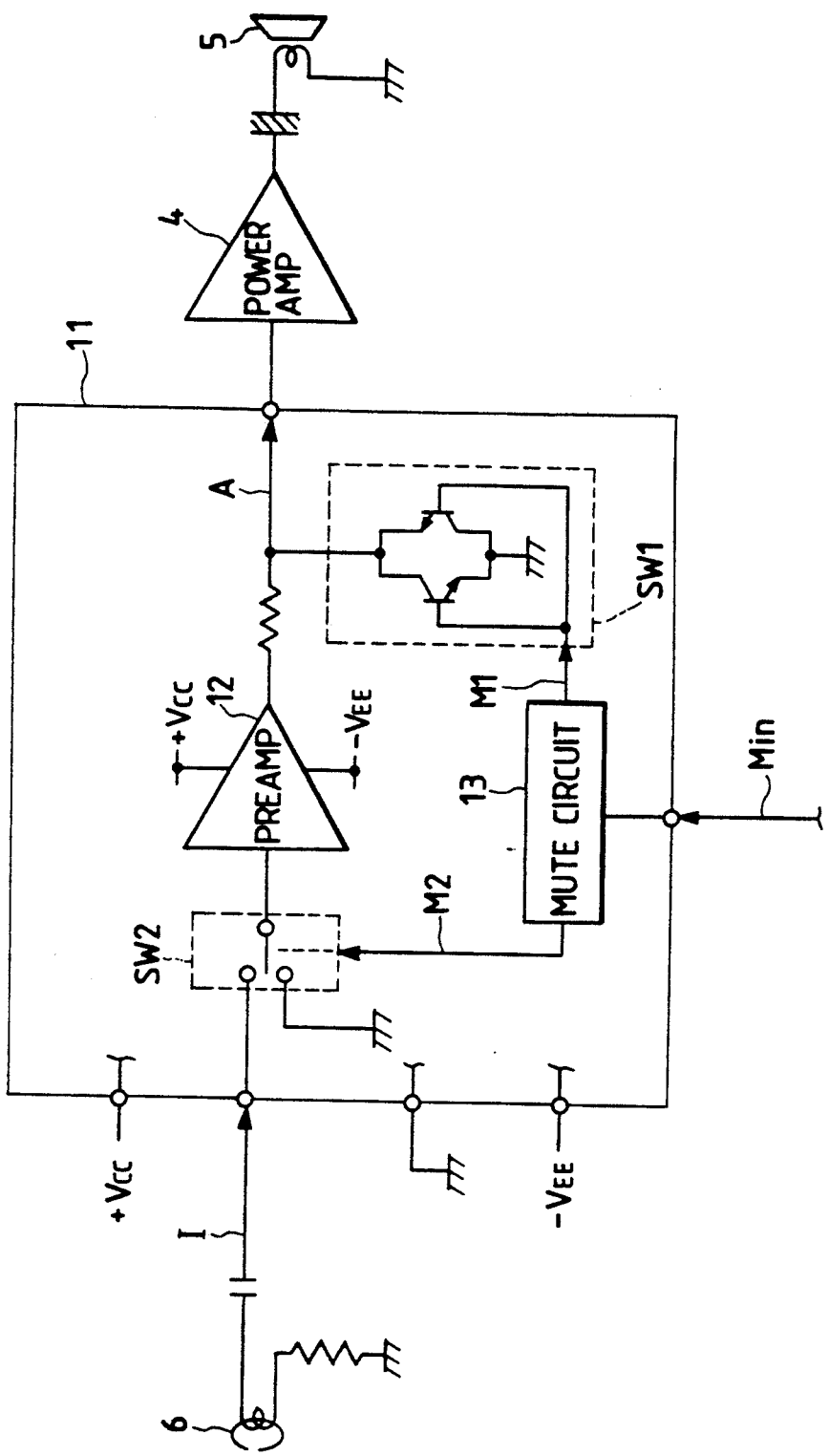
FIG. 1 is a block diagram of an audio signal amplifier circuit as applied to a tape recorder according to the present invention.

Referring to the accompanying drawing, an embodiment of the present invention will be described in detail. FIG. 1 is a block diagram of an audio signal amplifier circuit of the present invention, illustrating a playback circuit of a tape recorder in which an audio signal amplifier circuit in the form of an integrated circuit is applied to signal amplification at the input stage.

In FIG. 1, numeral 11 denotes an audio signal amplifier circuit in the form of an integrated circuit comprising a preamplifier 12, a mute circuit 13, switch circuits SW1, SW2 and the like. Numeral 6 denotes a magnetic head for reading the audio signal recorded on a tape, 4 a power amplifier, and 5 a speaker.

Figure 2:
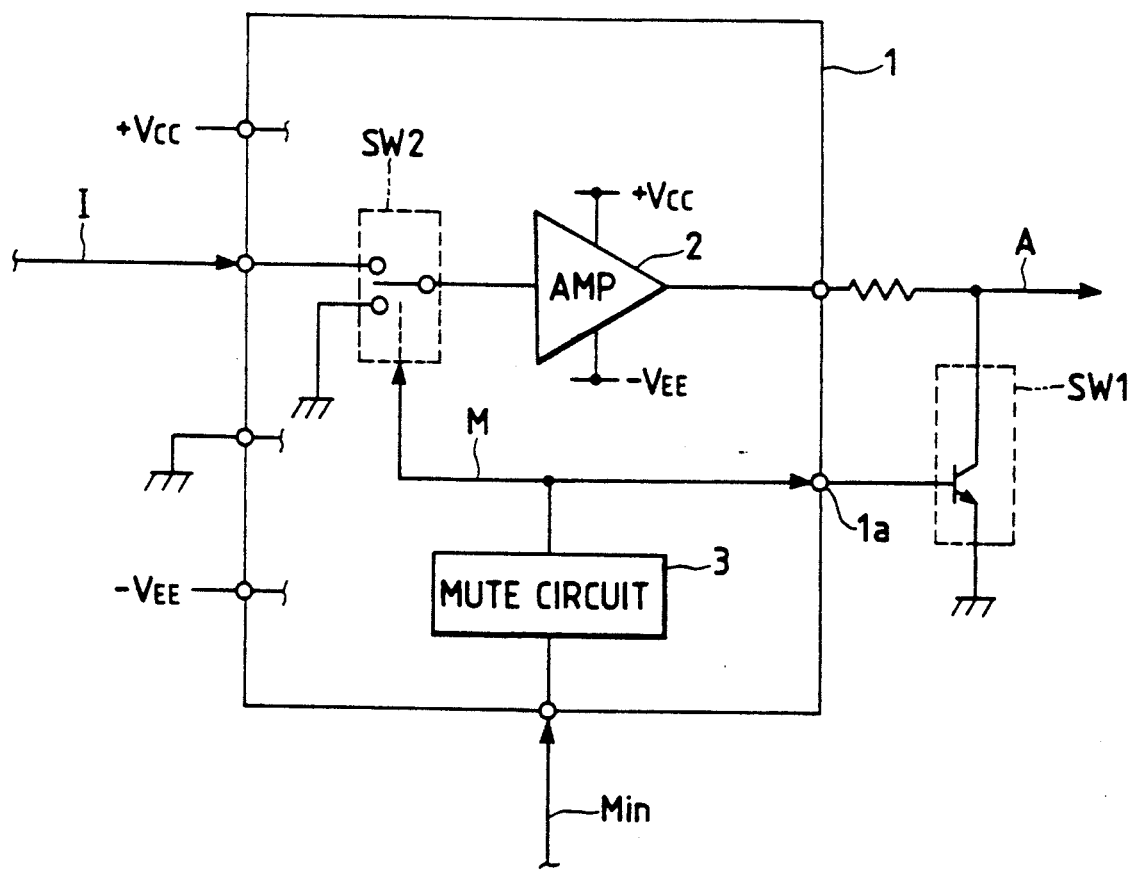
FIG. 2 is a block diagram of a conventional audio signal amplifier circuit.

The audio signal amplifier circuit 11 thus arranged in the embodiment shown is different from the conventional type of FIG. 2 in that the integrated circuit incorporates the switch circuit SW1 and that two mute control signals M1, M2 are generated: the mute control signal M1 is used to control the switch circuit SW1 and the mute control signal M2 to control the switch circuit SW2. In this case, an amplifier is of a type incorporating the preamplifier 12 for amplifying a microsignal at the input stage.

The operation of the audio signal amplifier circuit thus arranged in this embodiment will subsequently be described and its steady state will be described first.

The audio signal read by the magnetic head 6 from a tape is sent via a coupling capacitor to the audio signal amplifier circuit 11 as an audio input signal I. In this audio signal amplifier circuit 11, the mute control signals M1, M2 from the mute circuit 13 are naturally missing as no mute input signal Min exists in the steady state. The switch circuit SW2 causes an input terminal for the audio input signal I and the signal input line of the preamplifier 12 to be kept conducting, whereas the switch circuit SW1 is exerting no influence on the signal line of an audio output signal.

Consequently, on receiving the audio input signal I via the switch circuit SW2, the preamplifier 12 amplifies the signal and outputs what has been amplified as an audio output signal A. Further, on receiving the audio output signal A, the power amplifier 4 amplifies the signal and outputs via the coupling capacitor what has been amplified in order to drive the speaker. In the steady state, the audio signal recorded on the tape is amplified and played back, so that the sound thus reproduced is output from the speaker 5.

A description will subsequently be given of an unsteady state, that is, a specific case where a muting function is performed so as to suppress the production of unpleasant pop sound due to the noise caused by the turning on of power and the turning off of the supply of power.

In this case, the mute input signal Min is generated in accordance with the condition of a power supply circuit and the switch input (a generator circuit is not shown). On receiving the signal Min, the mute circuit 3 immediately generates the mute control signal M1. On receiving the mute control signal M1, the switch circuit SW1 immediately grounds the signal line of the audio output signal A, whereby the outputting of the audio output signal A is suppressed.

After that, that is, after the passage of sufficient time necessary for the switch circuit SW1 to complete the switching operation, the mute circuit 3 subsequently generates the mute control signal M2. On receiving the mute control signal M2, the switch circuit SW2 cuts the signal line of the audio input signal I, whereby even though the response time of the switch circuits varies in some degree, the muting function is fulfilled.

Incidentally, the switch circuit SW1 of FIG. 2 is formed by one NPN transistor, whereas what is shown in FIG. 1 is formed by two NPN transistors connected reversely in parallel to each other. With these transistors connected reversely in parallel to each other, the signal line can be grounded with a small resistance value resulting from the forward voltage drop of the transistor in either positive or negative state, despite the positive-to-negative oscillation of the audio output signal A with the ground potential as a reference. However, the transistor for the switch circuit is not limited to the NPN type but may be of PNP or MOS type and the number of such transistors is not limited to two but may be determined as occasion demands.

Although the playback circuit of a tape recorder has been described by way of example in the embodiment shown, the implementation of the present invention is needless to say not restricted to this example.

As will be understood from the description given, the number of IC terminals in the audio signal amplifier circuit according to the present invention can be made smaller than that in any conventional audio signal amplifier circuit and thereby the IC size becomes reducible. Moreover, by shifting the timing of generating mute control signal, the present invention has the effect of stabilizing the performance of the muting function without being affected by the variation of the switch circuit operating time.

WHAT IS CLAIMED IS:

1. An audio signal amplifier circuit comprising:
   an amplifier for amplifying an audio input signal and for outputting an audio output signal with a reference potential as an operating point;
   a mute circuit for generating a mute control signal on receiving and in accordance with a mute input signal;
   a first switch circuit, disposed at output side of said amplifier, for cutting off a signal line of the output side in response to said mute control signal; and
   a second switch circuit, disposed at input side of said amplifier, for cutting off a signal line of the input side in response to said mute control signal
   wherein said amplifier, said mute circuit, said first switch circuit, and said second switch circuit are incorporated in a one-chip integrated circuit.

2. An audio signal amplifier circuit as claimed in claim 1, wherein said mute circuit generates a first mute control signal on receiving said mute input signal, and subsequently generates a second mute control signal; and
   said first switch circuit cuts off said signal line of the output side in response to said first mute control circuit whereas said second switch circuit cuts off said signal line of the input side in response to said second mute control circuit.

3. An audio signal amplifier circuit as claimed in claim 1, wherein said first switch circuit make a short-circuit to said reference potential.

4. An audio signal amplifier circuit as claimed in claim 1, wherein said first switch circuit comprises two transistors being connected reversely in parallel each other.

* * * * *